United States Patent
Camacho et al.

(10) Patent No.: US 9,059,074 B2
(45) Date of Patent: Jun. 16, 2015

(54) INTEGRATED CIRCUIT PACKAGE SYSTEM WITH PLANAR INTERCONNECT

(75) Inventors: Zigmund Ramirez Camacho, Singapore (SG); Lionel Chien Hui Tay, Singapore (SG); Henry Descalzo Bathan, Singapore (SG); Abelardo Jr. Hadap Advincula, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 821 days.

(21) Appl. No.: 12/055,526

(22) Filed: Mar. 26, 2008

(65) Prior Publication Data
US 2009/0243082 A1 Oct. 1, 2009

(51) Int. Cl.
*H01L 23/02* (2006.01)
*H01L 23/00* (2006.01)
*H01L 21/56* (2006.01)
*H01L 21/683* (2006.01)
*H01L 23/31* (2006.01)
*H01L 23/495* (2006.01)
*H01L 29/04* (2006.01)

(52) U.S. Cl.
CPC .............. *H01L 24/19* (2013.01); *H01L 21/568* (2013.01); *H01L 21/6835* (2013.01); *H01L 23/3107* (2013.01); *H01L 23/49524* (2013.01); *H01L 2224/04105* (2013.01); *H01L 2224/20* (2013.01); *H01L 2924/01029* (2013.01); *H01L 2924/01082* (2013.01); *H01L 2924/14* (2013.01); *H01L 2924/15311* (2013.01); *H01L 2924/01006* (2013.01); *H01L 2924/01033* (2013.01)

(58) Field of Classification Search
CPC ... H01L 2924/00; H01L 33/50; H01L 31/048; H01L 33/486; H01L 27/14; H01L 31/05; H01L 24/19; H01L 21/568; H01L 21/6835; H01L 23/3107; H01L 23/49524
USPC .......... 257/666, 678, 687, 690–693, E23.031, 257/E23.052, E23.066, E23.068, 734, 667, 257/433, 434, 672, 676, 680, 696, 728, 735, 257/748, 787, E51.02, E23.001, 59, 72, 257/566, E23.011, E23.039, E23.116, 257/E23.124, E23.126, E23.178; 438/123, 438/124, 126, 127; 361/760
See application file for complete search history.

(56) References Cited

U.S. PATENT DOCUMENTS

| | | | | |
|---|---|---|---|---|
| 3,869,367 A * | 3/1975 | Sato et al. | ................ | 204/192.15 |
| 4,545,646 A * | 10/1985 | Chern et al. | .................. | 359/569 |
| 4,893,742 A * | 1/1990 | Bullock | ..................... | 228/111.5 |
| 5,209,817 A * | 5/1993 | Ahmad et al. | .................. | 216/18 |
| 5,321,204 A * | 6/1994 | Ko | ................. | 257/686 |
| 5,519,936 A | 5/1996 | Andros et al. | | |
| 5,638,596 A * | 6/1997 | McCormick | .................... | 29/827 |
| 5,668,405 A | 9/1997 | Yamashita | | |
| 5,753,857 A * | 5/1998 | Choi | ............................. | 174/542 |
| 5,773,323 A * | 6/1998 | Hur | ................. | 438/123 |
| 5,989,940 A * | 11/1999 | Nakajima | .................... | 438/127 |

(Continued)

OTHER PUBLICATIONS

Quirk. Semiconductor manufacturing technology, 2001, pp. 314-320.*

*Primary Examiner* — Galina Yushina
(74) *Attorney, Agent, or Firm* — Ishimaru & Associates LLP

(57) ABSTRACT

An integrated circuit package system includes: mounting an integrated circuit die adjacent to a lead; forming a first encapsulation around and exposing the integrated circuit die and the lead; and forming a planar interconnect between the integrated circuit die and the lead with the planar interconnect on the first encapsulation.

20 Claims, 6 Drawing Sheets

(56) References Cited

U.S. PATENT DOCUMENTS

| | | |
|---|---|---|
| 6,150,193 A | 11/2000 | Glenn |
| 6,239,496 B1 | 5/2001 | Asada |
| 6,281,437 B1 | 8/2001 | Anderson et al. |
| 6,335,565 B1 | 1/2002 | Miyamoto et al. |
| 6,342,406 B1 | 1/2002 | Glenn et al. |
| 6,407,381 B1 * | 6/2002 | Glenn et al. ............ 250/239 |
| 6,448,506 B1 | 9/2002 | Glenn et al. |
| 6,451,626 B1 * | 9/2002 | Lin ............................. 438/108 |
| 6,486,545 B1 | 11/2002 | Glenn et al. |
| 6,492,699 B1 | 12/2002 | Glenn et al. |
| 6,566,745 B1 | 5/2003 | Beyne et al. |
| 6,571,466 B1 | 6/2003 | Glenn et al. |
| 6,621,172 B2 | 9/2003 | Nakayama et al. |
| 6,650,019 B2 * | 11/2003 | Glenn et al. ................ 257/777 |
| 6,696,738 B1 * | 2/2004 | Tu et al. ...................... 257/433 |
| 6,703,713 B1 * | 3/2004 | Tseng et al. ................. 257/777 |
| 6,734,419 B1 * | 5/2004 | Glenn et al. ................. 250/239 |
| 6,762,117 B2 | 7/2004 | Lam et al. |
| 6,774,499 B1 | 8/2004 | Yang |
| 6,787,901 B2 | 9/2004 | Reyes et al. |
| 6,794,760 B1 | 9/2004 | Jaeck et al. |
| 6,821,817 B1 * | 11/2004 | Thamby et al. ............. 438/112 |
| 6,822,316 B1 | 11/2004 | Hsuan |
| 6,830,999 B2 * | 12/2004 | Deshmukh ................... 438/612 |
| 6,838,310 B1 | 1/2005 | Hsuan |
| 6,885,107 B2 | 4/2005 | Kinsman |
| 6,891,273 B2 | 5/2005 | Pu et al. |
| 6,946,325 B2 | 9/2005 | Yean et al. |
| 6,982,491 B1 | 1/2006 | Fan et al. |
| 7,208,345 B2 * | 4/2007 | Meyer et al. ................ 438/109 |
| 7,253,735 B2 * | 8/2007 | Gengel et al. ............ 340/572.7 |
| 7,262,497 B2 | 8/2007 | Fang |
| 7,547,977 B2 | 6/2009 | Song et al. |
| 2004/0212088 A1 | 10/2004 | Chen et al. |
| 2005/0006745 A1 | 1/2005 | Nishimura |
| 2005/0046000 A1 | 3/2005 | Seng et al. |
| 2005/0051859 A1 | 3/2005 | Hoffman |
| 2005/0275050 A1 * | 12/2005 | Tsai et al. .................... 257/433 |
| 2006/0024505 A1 * | 2/2006 | Keh et al. ..................... 428/414 |
| 2006/0049493 A1 * | 3/2006 | Lee et al. ..................... 257/666 |
| 2006/0186514 A1 | 8/2006 | Shim et al. |
| 2007/0063331 A1 | 3/2007 | Kwon et al. |
| 2007/0170554 A1 * | 7/2007 | Camacho et al. ............ 257/666 |
| 2008/0009102 A1 * | 1/2008 | Yang et al. ................... 438/126 |
| 2008/0093717 A1 | 4/2008 | Huang et al. |
| 2008/0197368 A1 * | 8/2008 | Harle ............................. 257/98 |

\* cited by examiner

INTEGRATED CIRCUIT PACKAGE SYSTEM WITH PLANAR INTERCONNECT

TECHNICAL FIELD

The present invention relates generally to an integrated circuit package system and more particularly to an integrated circuit package system with planar interconnect.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. The packages have a lead frame whose leads are projected from the package body, to provide a path for signal transfer between the die and external devices. Other conventional package configurations have contact terminals or pads formed directly on the surface of the package. Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

In response to the demands for improved packaging, many innovative package designs have been conceived and brought to market. The multi-chip module has achieved a prominent role in reducing the board space used by modern electronics. However, multi-chip modules, whether vertically or horizontally arranged, all require volume of individual chip package being as small as possible. However, bond wires are a major restriction of reducing height of individual chip package.

Thus, a need still remains for an integrated circuit package system providing low cost manufacturing, improved yields, reduction of integrated circuit package dimensions, and flexible stacking and integration configurations. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: mounting an integrated circuit die adjacent to a lead; forming a first encapsulation around and exposing the integrated circuit die and the lead; and forming a planar interconnect between the integrated circuit die and the lead with the planar interconnect on the first encapsulation.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
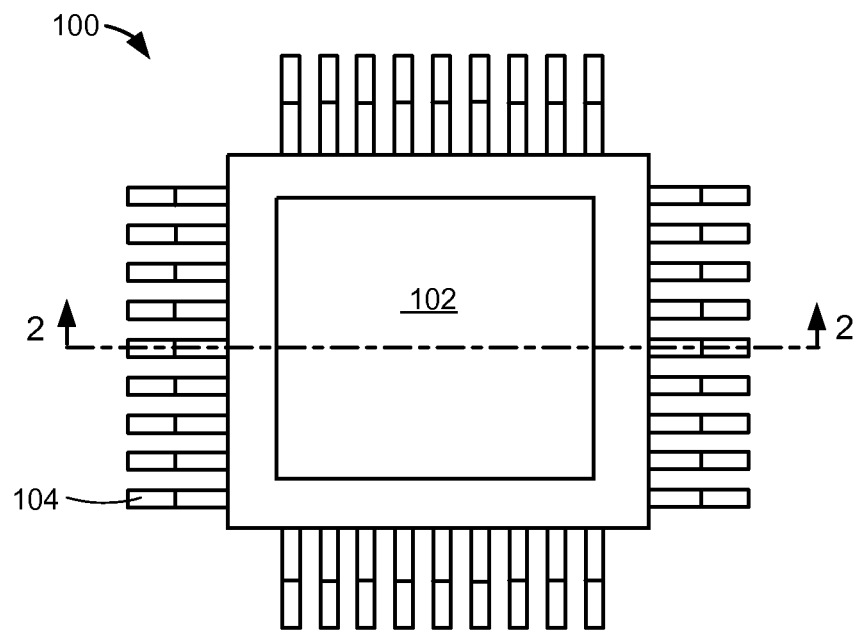
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit package system 100 in a first embodiment of the present invention. The top view depicts a first encapsulation 102, such as an epoxy molding compound, and leads 104, such as J-leads, exposed from the first encapsulation 102. The first encapsulation 102 exposes the leads 104. For example, the integrated circuit package system 100 is shown as a quad flat package ("QFP") type with formed leads.

Figure 2:
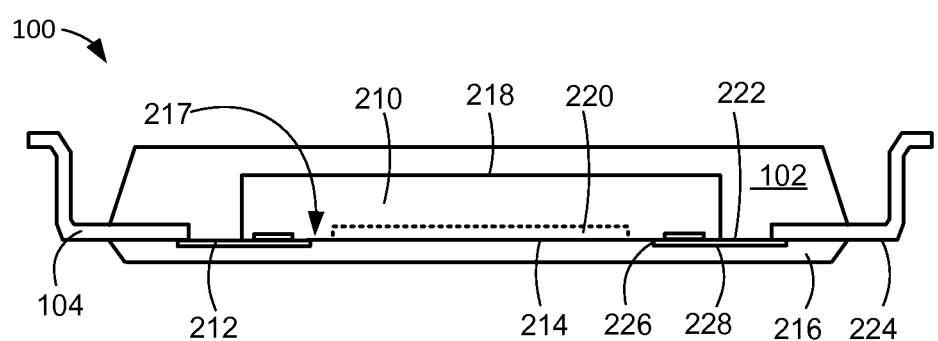
FIG. 2 is a cross-sectional view of the integrated circuit package system along line 2—2 of FIG. 1.

Referring now to FIG. 2, therein is shown a cross-sectional view of the integrated circuit package system 100 along line 2—2 of FIG. 1. The cross-sectional view depicts an integrated circuit die 210 and the leads 104 being connected together by planar interconnects 212. The first encapsulation 102 is in direct contact with the integrated circuit die 210 and the leads 104, exposing both an active side 214 of the integrated circuit die 210, and the leads 104. The planar interconnects 212 is preferably in direct contact with the first encapsulation 102 between the integrated circuit die 210 and the leads 104. The planar interconnects 212 are preferably planar and in direct contact with the first encapsulation 102, the integrated circuit die 210, and the leads 104. An interconnect top side 222 is preferably coplanar with the active side 214 of the integrated circuit die 210 and a lead bottom side 224. A second encapsulation 216 covers the active side 214 of the integrated circuit die 210, a portion of the lead bottom side 224, a non-horizontal side 226 of the planar interconnect 212, and a interconnect bottom side 228 of the planar interconnect 212 opposite from the interconnect top side 222 of the planar interconnects 212. A top surface 217 of the second encapsulation 216 is coplanar with the lead bottom side 224, the interconnect top side 222, and the active side 214. The interconnect top side 222 of the planar interconnects 212 is coplanar and directly on the first encapsulation 102, the active side 214 of the integrated circuit die 210, and the lead bottom side 224 of the lead 104.

The integrated circuit die 210 includes a non-active side 218 and the active side 214, wherein the active side 214 includes active circuitry fabricated thereon. As an example, a dotted line region 220 of the integrated circuit die 210 is optional. The dotted line region 220 can represent optically active circuitry fabricated thereon. Optically active circuitry can be used for a number of applications, such as image sensors and other types of applications requiring electromagnetic waves to activate the operation of the integrated circuit package system 100.

In this example, the leads 104 are shown as a J-lead bent towards the first encapsulation 102 for connecting to the next system level (not shown), such as a printed circuit board or another integrated circuit. The leads 104 can also be J-lead bent towards the second encapsulation 216 or C-lead also bent towards the first encapsulation 102 or the second encapsulation 216.

The planar interconnects 212 connect the active side 214, such as bond pads at the active side 214, and the leads 104. In this example, although the planar interconnects 212 are shown as a single layer, the planar interconnects 212 can include multiple layers of passivation and metal layers. The metal layer is preferably sputtered copper layer. Inter-layer connectors (not shown), such as vias, can optionally connect the metal layers.

The second encapsulation 216 can be laminated epoxy layer, screen/stencil-printed epoxy layer or any other passivation material. For applications, such as image sensors and other type of applications requiring electromagnetic waves to activate its operation, the second encapsulation 216 can be transparent for a predetermined wavelength.

It has been discovered that the present invention provides ultra thin integrated circuit package system with the planar interconnect. Eliminating wire-bonding process reduces cost, shortens cycle time, and improves reliability. Eliminating bonded wires can also provide an ultra thin package for numerous applications, such as an internal stacking component in a package-in-package (PIP) system module. The planar interconnect also improves the reliability and yield of the integrated circuit package system by eliminating wire loops and sweeps accompanying bond wires.

Figure 3:
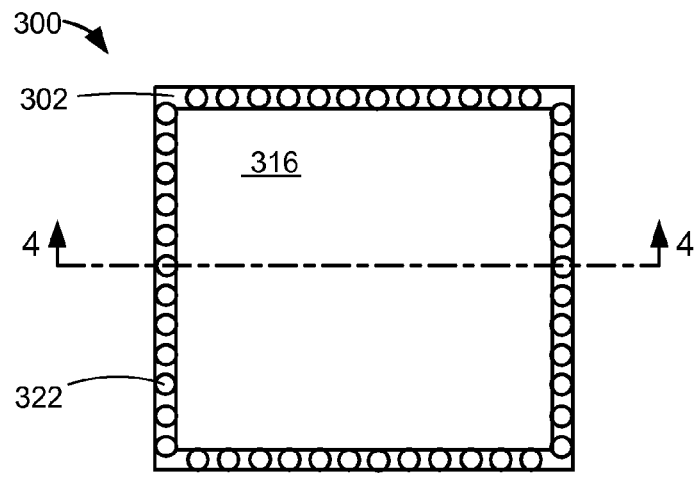
FIG. 3 is a top view of an integrated circuit package system in a second embodiment of the present invention.

Referring now to FIG. 3, therein is shown a top view of an integrated circuit package system 300 in a second embodiment of the present invention. The top view depicts a first encapsulation 302, such as a cover of epoxy molding compound, around a second encapsulation 316, such as a cover including an epoxy molding compound or an optical grade material. The first encapsulation 302 is shown under external interconnects 322, such as solder balls.

Figure 4:
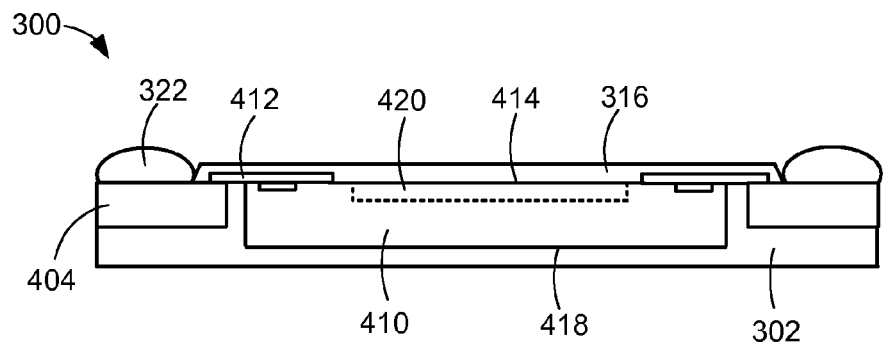
FIG. 4 is a cross-sectional view of the integrated circuit package system along line 4—4 of FIG. 3.

Referring now to FIG. 4, therein is shown a cross-sectional view of the integrated circuit package system 300 along line 4—4 of FIG. 3. The cross-sectional view depicts an integrated circuit die 410 and leads 404 connected by planar interconnects 412. The first encapsulation 302 can cover the integrated circuit die 410 and the leads 404, exposing both an active side 414 of the integrated circuit die 410, and the leads 404. The planar interconnects 412 are preferably on the first encapsulation 302 between the integrated circuit die 410 and the leads 404. The planar interconnects 412 are preferably planar on the first encapsulation 302, the integrated circuit die 410, and the leads 404. The second encapsulation 316 covers the active side 414 of the integrated circuit die 410, the leads 404 and the planar interconnects 412.

The integrated circuit die 410 has a non-active side 418 and the active side 414, wherein the active side 414 includes active circuitry fabricated thereon. As an example, a dotted line region 420 is shown at the active side 414. The dotted line region 420 indicates an area optically active circuitry fabricated thereon.

In this example, the leads 404 are shown as lead stand-off attaching to the external interconnects 322. The external interconnects 322 can connect to the next system level (not shown), such as a printed circuit board or another integrated circuit package system.

The planar interconnects 412 can be on the first encapsulation 302 and connects the active side 414 and the leads 404. In this example, although the planar interconnects 412 are shown as a single layer, the planar interconnects 412 can include multiple layers, such as passivation and metal layers. The metal layer is preferably sputtered copper layer. Interlayer connectors (not shown), such as vias, can optionally connect the metal layers. The second encapsulation 316 can be laminated epoxy layer, screen/stencil-printed epoxy layer or any other passivation material.

Figure 5:
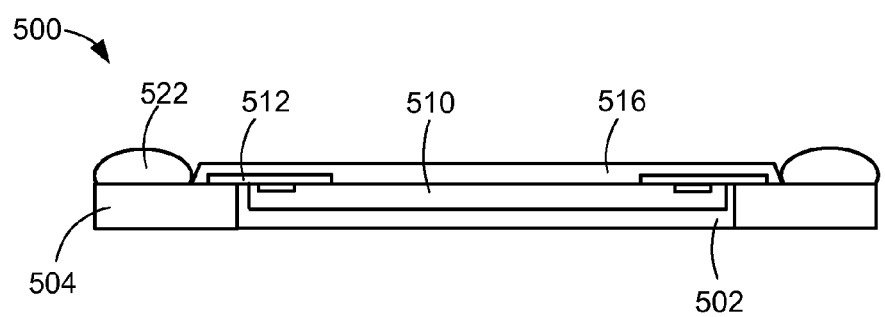
FIG. 5 is a cross-sectional view of an integrated circuit package system exemplified by the top view of FIG. 3 along line 4—4 of FIG. 3 in a third embodiment of the present invention.

Referring now to FIG. 5, therein is shown a cross-sectional view of an integrated circuit package system 500 exemplified by the top view of FIG. 3 along line 4——4 of FIG. 3 in a third embodiment of the present invention. The integrated circuit package system 500 includes structural similarities to the integrated circuit package system 300 of FIG. 4.

Planar interconnects 512 can be on a first encapsulation 502 connecting an integrated circuit die 510 and leads 504. The planar interconnects 512 are preferably planar on the first encapsulation 502, the integrated circuit die 510, and the leads 504. A second encapsulation 516 covers the integrated circuit die 510 and the planar interconnects 512. The second encapsulation 516 partially covers the leads 504.

The first encapsulation 502 can be coplanar with the leads 504 at an opposing side of the first encapsulation 502 with the planar interconnects 512. This enables potential connections with the integrated circuit package system 500 with the leads 504 at a side opposite external interconnects 522, such as the solder balls.

Figure 6:
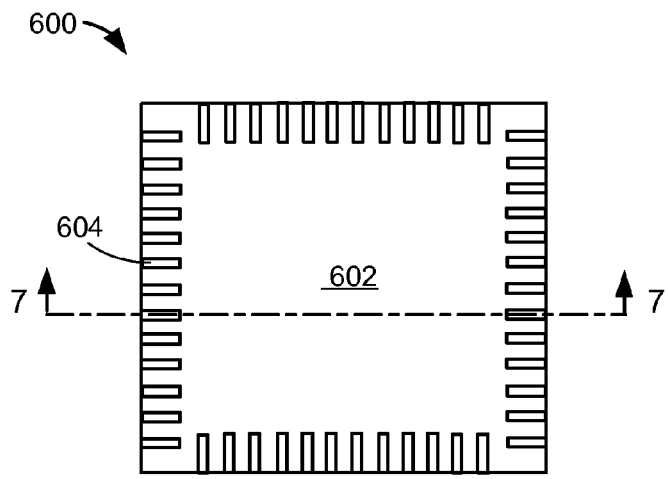
FIG. 6 is a top view of an integrated circuit package system in a fourth embodiment of the present invention.

Referring now to FIG. 6, therein is shown a top view of an integrated circuit package system 600 in a fourth embodiment of the present invention. The top view depicts a first encapsulation 602, such as an epoxy molding compound, and leads 604, exposed from the first encapsulation 602.

Figure 7:
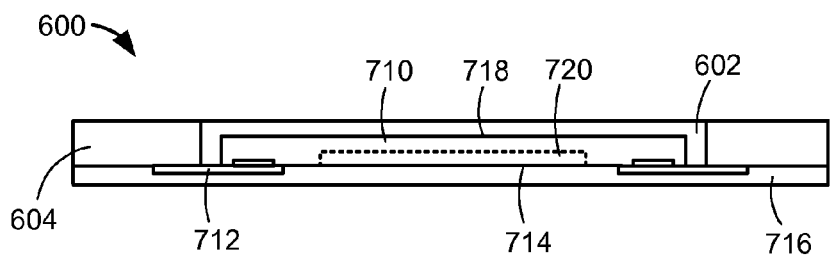
FIG. 7 is a cross-sectional view of the integrated circuit package system along line 7—7 of FIG. 6.

Referring now to FIG. 7, therein is shown a cross-sectional view of the integrated circuit package system 600 along line 7——7 of FIG. 6. The cross-sectional view depicts an integrated circuit die 710 and the leads 604 being connected together by planar interconnects 712. The first encapsulation 602 is over the integrated circuit die 710 and surrounds the leads 604 exposing an active side 714 of the integrated circuit die 710 and a portion of the leads 604. The planar interconnects 712 are preferably planar on the first encapsulation 602, the integrated circuit die 710, and the leads 604. A second encapsulation 716 covers the active side 714 of the integrated circuit die 710, the leads 604 and the planar interconnects 712.

The integrated circuit die 710 has a non-active side 718 and the active side 714, wherein the active side 714 includes active circuitry fabricated thereon. For example, a dotted line region 720 is shown along the active side 714. The dotted line region 720 can represent an area having optically active circuitry fabricated thereon.

The leads 604 can connect to the next system level (not shown), such as a printed circuit board or another integrated circuit package system.

Figure 8:
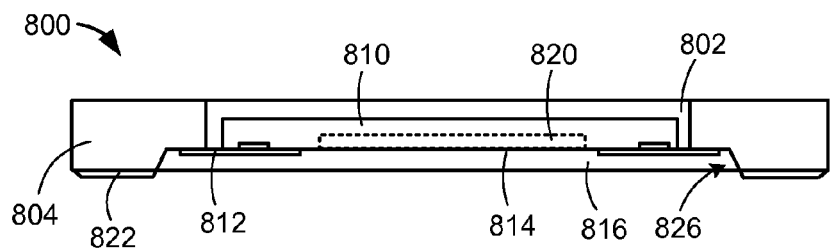
FIG. 8 is a cross-sectional view of an integrated circuit package system exemplified by the bottom view of FIG. 6 along line 7—7 of FIG. 6 in a fifth embodiment of the present invention.

Referring now to FIG. 8, therein is shown a cross-sectional view of an integrated circuit package system 800 exemplified by the bottom view of FIG. 6 along line 7——7 of FIG. 6 in a fifth embodiment of the present invention. The cross-sectional view depicts an integrated circuit die 810 and leads 804 being connected together by planar interconnects 812. A first encapsulation 802 is over the integrated circuit die 810 and surrounding the leads 804 exposing an active side 814 of the integrated circuit die 810 and a portion of the leads 804 connected to external interconnects 822. The planar interconnects 812 are preferably planar on the first encapsulation 802, the integrated circuit die 810, and the leads 804. A second encapsulation 816 covers the active side 814 and the planar interconnects 812.

For example, a dotted line region 820 is shown along the active side 814. The dotted line region 820 can represent an area having optically active circuitry fabricated thereon.

In this example, the leads 804 are shown as a stand-off portion 826 half-etched. The stand-off portion 826 is in coplanar with the integrated circuit die 810 with the planar interconnects 812 in between. The non-stand-off portion of the leads 804 can be plated with the external interconnects 822, such as solder.

Figure 9:
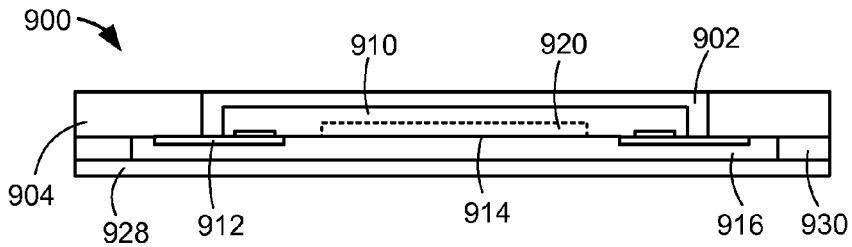
FIG. 9 is a cross-sectional view of an integrated circuit package system exemplified by the bottom view of FIG. 6 along line 7—7 of FIG. 6 in a sixth embodiment of the present invention.

Referring now to FIG. 9, therein is shown a cross-sectional view of an integrated circuit package system 900 exemplified by the bottom view of FIG. 6 along line 7——7 of FIG. 6 in a sixth embodiment of the present invention. The cross-sectional view depicts an integrated circuit die 910 and leads 904 connected by planar interconnects 912. A first encapsulation 902 is over the integrated circuit die 910 and surrounds the leads 904 exposing an active side 914 of the integrated circuit die 910 and a portion of the leads 904. The planar interconnects 912 are preferably planar on the first encapsulation 902, the integrated circuit die 910, and the leads 904. A second encapsulation 916 covers the active side 914 of the integrated circuit die 910, the leads 904 and the planar interconnects 912.

For example, a dotted line region 920 is along the active side 914. The dotted line region 920 can represent an area having optically active circuitry fabricated thereon. The second encapsulation 916 can include a transparent optical grade passivation layer. A transparent glass 928 can be optionally attached to the second encapsulation 916.

The transparent glass 928 can be attached with the leads 904 with an adhesive 930, depicted as vertical dotted lines. With the adhesive 930, the second encapsulation 916 is optional.

Figure 10:
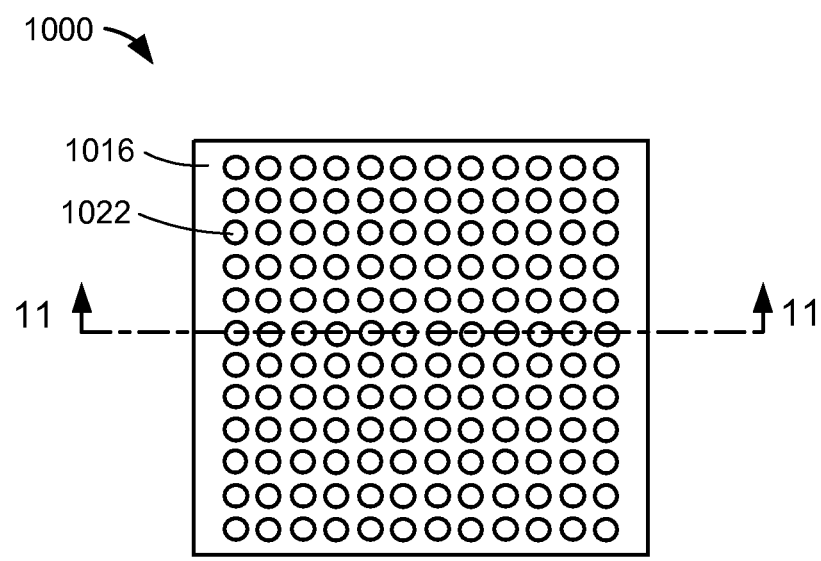
FIG. 10 is a bottom view of an integrated circuit package system in a seventh embodiment of the present invention.

Referring now to FIG. 10, therein is shown a bottom view of an integrated circuit package system 1000 in a seventh embodiment of the present invention. The bottom view depicts a second encapsulation 1016, such as an epoxy molding compound, and external interconnects 1022, such as solder bumps, exposed from the second encapsulation 1016.

Figure 11:
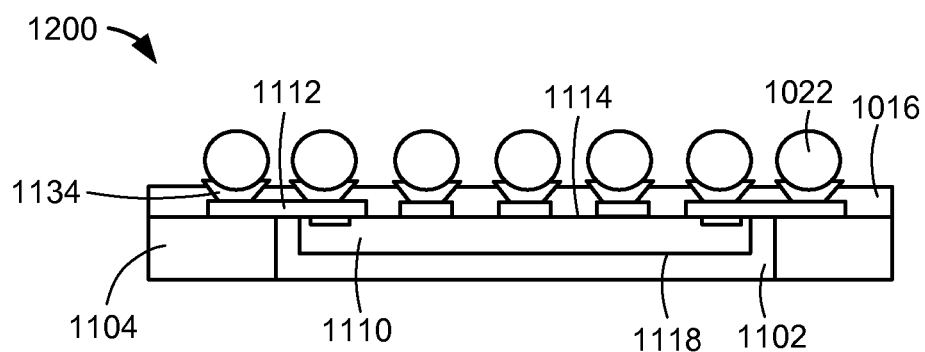
FIG. 11 is a cross-sectional view of the integrated circuit package system along line 11—11 of FIG. 10.

Referring now to FIG. 11, therein is shown a cross-sectional view of the integrated circuit package system 1000 along line 11——11 of FIG. 10. The cross-sectional view depicts an integrated circuit die 1110 and leads 1104 connected by planar interconnects 1112. The integrated circuit die 1110 has a non-active side 1118 and an active side 1114, wherein the active side 1114 includes active circuitry fabricated thereon. A first encapsulation 1102 is around the integrated circuit die 1110 and the leads 1104 exposing the active side 1114 and a portion of the leads 1104. The planar interconnects 1112 are preferably planar on the first encapsulation 1102, the integrated circuit die 1110, and the leads 1104.

The planar interconnects 1112 can connect with the external interconnects 1022 through an interface structure 1134, such as a bump metallization or under bump metallization. The second encapsulation 1016 can cover the active side 1114, the leads 1104, and the planar interconnects 1112. The second encapsulation 1016 can expose the interface structure 1134.

Figure 12:
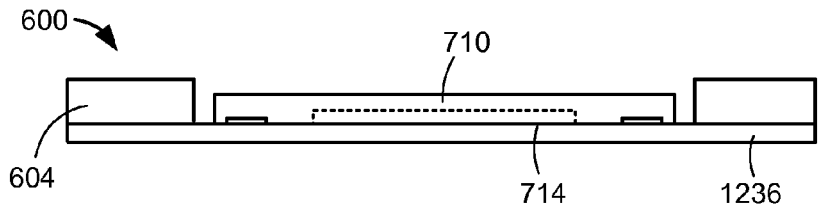
FIG. 12 is the integrated circuit package system of FIG. 7 in an attaching step of the integrated circuit die.

Referring now to FIG. 12, therein is shown the integrated circuit package system 600 of FIG. 7 in an attaching step of the integrated circuit die 710. The cross-sectional view depicts the integrated circuit die 710 mounts to a coverlay tape 1236 and is between the leads 604. The active side 714 can be facing the coverlay tape 1236. In this example, the height of the leads 604 is greater than the height of the integrated circuit die 710.

Figure 13:
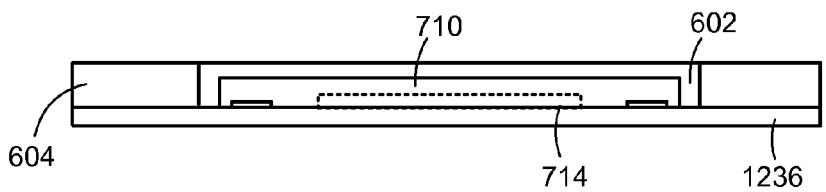
FIG. 13 is the structure of FIG. 12 in a molding step of the first encapsulation.

Referring now to FIG. 13, therein is shown the structure of FIG. 12 in a molding step of the first encapsulation 602. The first encapsulation 602 is covering the integrated circuit die 710. The horizontal sides of the leads 604 are not covered by the first encapsulation 602. As an example, the first encapsulation 602 is shown as coplanar with the horizontal sides of the leads 604. The coverlay tape 1236 provides the structure boundary such that the active side 714 is coplanar with the leads 604 and the first encapsulation 602.

Figure 14:
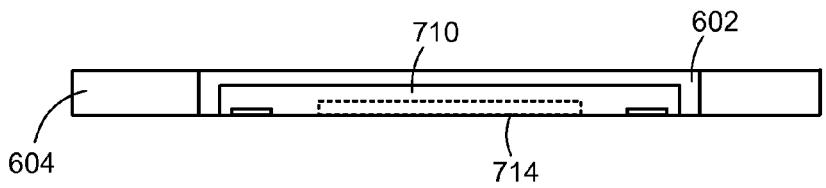
FIG. 14 is the structure of FIG. 13 in a tape removing step of the integrated circuit die and the leads.

Referring now to FIG. 14, therein is shown the structure of FIG. 13 in a tape removing step of the integrated circuit die 710 and the leads 604. The coverlay tape 1236 of FIG. 12 can be peeled off to expose the active side 714 of the integrated circuit die 710, the leads 604, and the first encapsulation 602.

Figure 15:
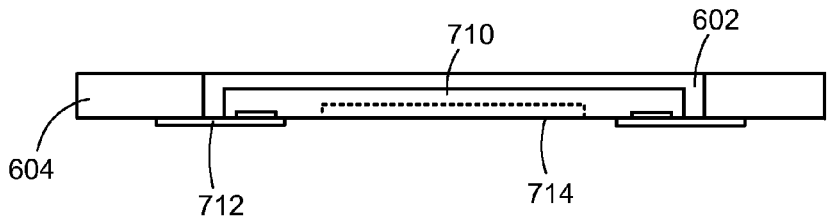
FIG. 15 is the structure of FIG. 14 in a forming step of the planar interconnect.

Referring now to FIG. 15, therein is shown the structure of FIG. 14 in a forming step of the planar interconnects 712. The planar interconnects 712 can be formed to connect the active side 714, such as bond pads at the active side 714, of the integrated circuit die 710 and the leads 604. The planar interconnects 712 can include various passivation layers and metal layers. The planar interconnects 712 can be formed with sputtered copper layer. The planar interconnects 712 are planar on and across the first encapsulation 602, the integrated circuit die 710, and the leads 604.

Figure 16:
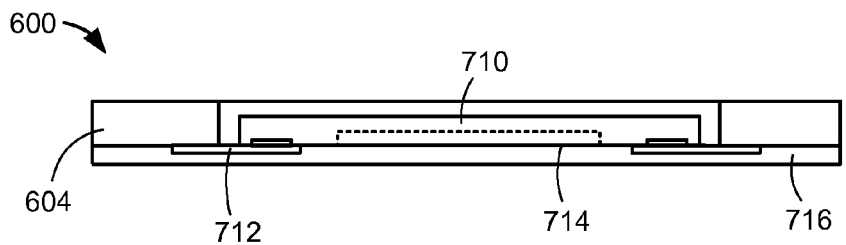
FIG. 16 is the structure of FIG. 15 in a forming step of the second encapsulation.

Referring now to FIG. 16, therein is shown the structure of FIG. 15 in a forming step of the second encapsulation 716. The second encapsulation 716 can be formed to cover the active side 714 of the integrated circuit die 710, the leads 604, and the planar interconnects 712. The second encapsulation 716 can be laminated epoxy layer, screen/stencil-printed epoxy layer or any other passivation material. The structure with the second encapsulation 716 can undergo singulation forming the integrated circuit package system 600.

Figure 17:
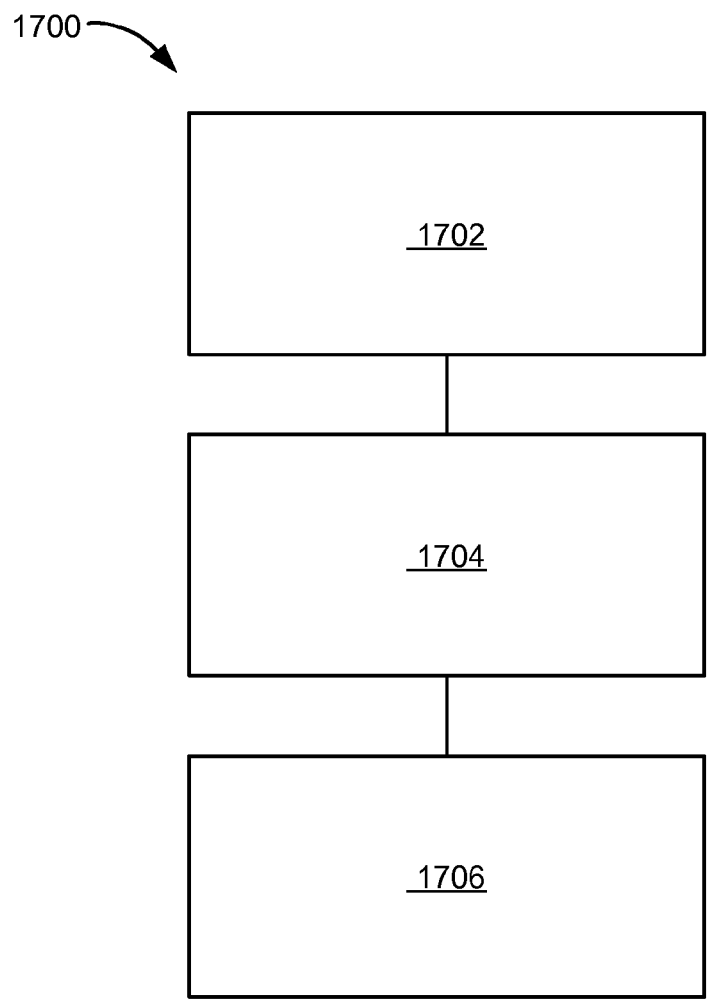
FIG. 17 is a flow chart of an integrated circuit package system for manufacturing of the integrated circuit package system in an embodiment of the present invention.

Referring now to FIG. 17, therein is shown a flow chart of an integrated circuit package system 1700 for manufacturing of the integrated circuit package system 100 in an embodiment of the present invention. The system 1700 includes mounting an integrated circuit die adjacent to a lead in a block 1702; forming a first encapsulation around and exposing the integrated circuit die and the lead in a block 1704; and forming a planar interconnect between the integrated circuit die and the lead with the planar interconnect on the first encapsulation in a block 1706.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package-in-package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto for set forth herein or shown in the accompanying drawings are to be interpreted in an illustrative and non-limiting sense.

What is claimed is:

1. A method of manufacture of an integrated circuit package system comprising:
   mounting an integrated circuit die adjacent to a lead,
   forming a first encapsulation in direct contact with the integrated circuit die and the lead, the first encapsulation exposing an active side of the integrated circuit die and the lead;
   forming a planar interconnect having an interconnect top side in direct contact with the active side of the integrated circuit die, the lead bottom side of the lead, and the first encapsulation; and
   forming a second encapsulation covering a non-horizontal side of the planar interconnect, the second encapsulation in direct contact with the active side of the integrated circuit die, the lead bottom side of the lead, and the bottom side of the planar interconnect opposite from the interconnect top side, and the second encapsulation is a transparent laminated epoxy layer, a transparent screen printed epoxy layer, or a transparent stencil printed epoxy layer for image sensor applications and electromagnetic wave activation applications, wherein a top surface of the second encapsulation coplanar with the lead bottom side of the lead, the interconnect top side, and the active side of the integrated circuit die.

2. The method as claimed in claim 1 wherein forming the second encapsulation includes covering the planar interconnect and the integrated circuit die with the second encapsulation.

3. The method as claimed in claim 1 wherein forming the planar interconnect includes forming the planar interconnect in direct contact with the integrated circuit die, the first encapsulation, and the lead.

4. The method as claimed in claim 1 wherein forming the first encapsulation in direct contact with and exposing the integrated circuit die and the lead includes forming the first encapsulation coplanar with both the lead bottom side and the active side of the integrated circuit die.

5. The method as claimed in claim 1 further comprising coupling an external interconnect with the lead.

6. A method of manufacture of an integrated circuit package system, comprising:

mounting an integrated circuit die adjacent to a lead;
forming a first encapsulation around the integrated circuit die and the lead with an active side of the integrated circuit die and the lead exposed;
forming a planar interconnect in direct contact with the active side and the lead, with the planar interconnect on the first encapsulation; and
forming a second encapsulation covering a non-horizontal side of the planar interconnect; the second encapsulation in direct contact with the active side of the integrated circuit die, a lead bottom side of the lead, and an interconnect bottom side of the planar interconnect that is opposite from an interconnect top side, the second encapsulation is a transparent laminated epoxy layer, a transparent screen printed epoxy layer, or a transparent stencil printed epoxy layer for image sensor applications and electromagnetic wave activation applications,
a top surface of the second encapsulation coplanar with the lead bottom side of the lead, the interconnect top side, and the active side of the integrated circuit die.

7. The method as claimed in claim 6 wherein forming the second encapsulation includes forming the second encapsulation having a transparent property and covering the planar interconnect and the integrated circuit die.

8. The method as claimed in claim 6 wherein forming the second encapsulation includes forming the second encapsulation adjacent to the lead and covering the planar interconnect and the integrated circuit die.

9. The method as claimed in claim 6 wherein the integrated circuit die includes an optically active circuitry.

10. The method as claimed in claim 6 further comprising forming an external interconnect coupled to the planar interconnect.

11. An integrated circuit package system comprising:
a lead;
an integrated circuit die adjacent to the lead;
a first encapsulation in direct contact with the integrated circuit die and the lead, the first encapsulation exposing an active side of the integrated circuit die and the lead;
a planar interconnect having an interconnect top side in direct contact with the active side of the integrated circuit die, a lead bottom side of the lead, and the first encapsulation; and
a second encapsulation covers a non-horizontal side of the planar interconnect, the second encapsulation in direct contact with the active side of the integrated circuit die, the lead bottom side of the lead, and the interconnect bottom side of the planar interconnect opposite from the interconnect top side, the second encapsulation is a transparent laminated epoxy layer, a transparent screen printed epoxy layer, or a transparent stencil printed epoxy layer for image sensor applications and electromagnetic wave activation applications,
a top surface of the second encapsulation coplanar with the lead bottom side of the lead, the interconnect top side, and the active side of the integrated circuit die.

12. The system as claimed in claim 11 wherein the second encapsulation covers the planar interconnect and the integrated circuit die.

13. The system as claimed in claim 11 wherein the planar interconnect is in direct contact with the integrated circuit die, the first encapsulation, and the lead.

14. The system as claimed in claim 11 wherein the first encapsulation is coplanar with both the lead bottom side and the active side of the integrated circuit die.

15. The system as claimed in claim 11 further comprising an external interconnect coupled with the lead.

16. The system as claimed in claim 11 wherein:
the integrated circuit die includes the active side;
the first encapsulation exposes the active side and the lead; and
the planar interconnect in direct contact with the active side and the lead.

17. The system as claimed in claim 16 wherein the second encapsulation, having a transparent property, covers the planar interconnect and the integrated circuit die.

18. The system as claimed in claim 16 wherein the second encapsulation, adjacent to the lead, covers the planar interconnect and the integrated circuit die.

19. The system as claimed in claim 16 wherein the integrated circuit die includes an optically active circuitry.

20. The system as claimed in claim 16 further comprising an external interconnect coupled to the planar interconnect.

* * * * *